United States Patent [19]

Oda et al.

[11] Patent Number: 5,010,842

[45] Date of Patent: Apr. 30, 1991

[54] APPARATUS FOR FORMING THIN FILM

[75] Inventors: Masao Oda; Yoshimi Kinoshita; Masahiro Hayama, all of Hyogo, Japan

[73] Assignee: Mitsubishi Denki Kabushiki Kaisha, Tokyo, Japan

[21] Appl. No.: 362,745

[22] Filed: Jun. 7, 1989

[30] Foreign Application Priority Data

Oct. 25, 1988 [JP] Japan .................. 63-268746

[51] Int. Cl.$^5$ .............................. C23C 16/50
[52] U.S. Cl. .................... 118/723; 118/715; 118/725; 427/39; 427/255.2
[58] Field of Search ............ 118/715, 723, 725; 156/345, 646; 204/192.12; 427/39, 255.1, 255.2

[56] References Cited

U.S. PATENT DOCUMENTS

| 4,262,631 | 4/1981 | Kubacki | 118/723 |
| 4,434,188 | 2/1984 | Kamo et al. | 427/39 |
| 4,689,093 | 8/1987 | Ishihara et al. | 427/255.1 |
| 4,716,852 | 1/1988 | Tsujii et al. | 118/723 |

FOREIGN PATENT DOCUMENTS

| 58-27656 | 6/1983 | Japan . | |
| 59-4028 | 1/1984 | Japan | 156/345 |
| 60-189928 | 9/1985 | Japan | 118/715 |
| 60-194078 | 10/1985 | Japan | 118/723 |
| 61-64124 | 4/1986 | Japan | 118/723 |
| 61-79773 | 4/1986 | Japan | 118/719 |
| 62-13573 | 1/1987 | Japan | 118/723 |
| 62-152122 | 7/1987 | Japan | 118/718 |
| 63-184322 | 7/1988 | Japan . | |
| 63-186411 | 8/1988 | Japan | 427/255.1 |
| 63-204731 | 8/1988 | Japan | 118/715 |
| 598630 | 3/1978 | U.S.S.R. | 118/715 |

OTHER PUBLICATIONS

Brodsky, M. H. and I. Haller, "Method of Preparing Hydrogenated Amorphous Silicon", IBM Technical Disclosure Bulletin, vol. 22, No. 8A, (Jan. 1980), pp. 3391-3392.

Primary Examiner—Norman Morgenstern
Assistant Examiner—Terry J. Owens
Attorney, Agent, or Firm—Rothwell, Figg, Ernst & Kurz

[57] ABSTRACT

Apparatus for forming a thin film on a substrate surface by a CVD (Chemical Vapor Deposition) method which includes diffusing pipes for diffusing and supplying a first reactive gas, and uniformizing plates for supplying uniformly an active species formed through excitation of a second reactive gas. The first reactive gas and the active species are mixed uniformly with each other, and the resultant uniform mixture is supplied uniformly to the substrate surface, whereby a uniform film deposition rate is obtained in a reaction zone in which the thin film is formed, and a uniform thin film is formed over the entire substrate surface even when the area of the substrate surface is large.

6 Claims, 9 Drawing Sheets

FIG. 7
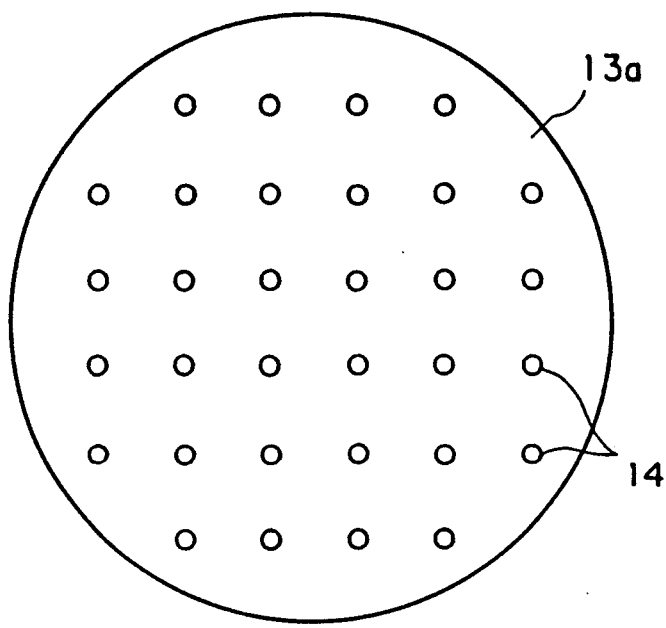
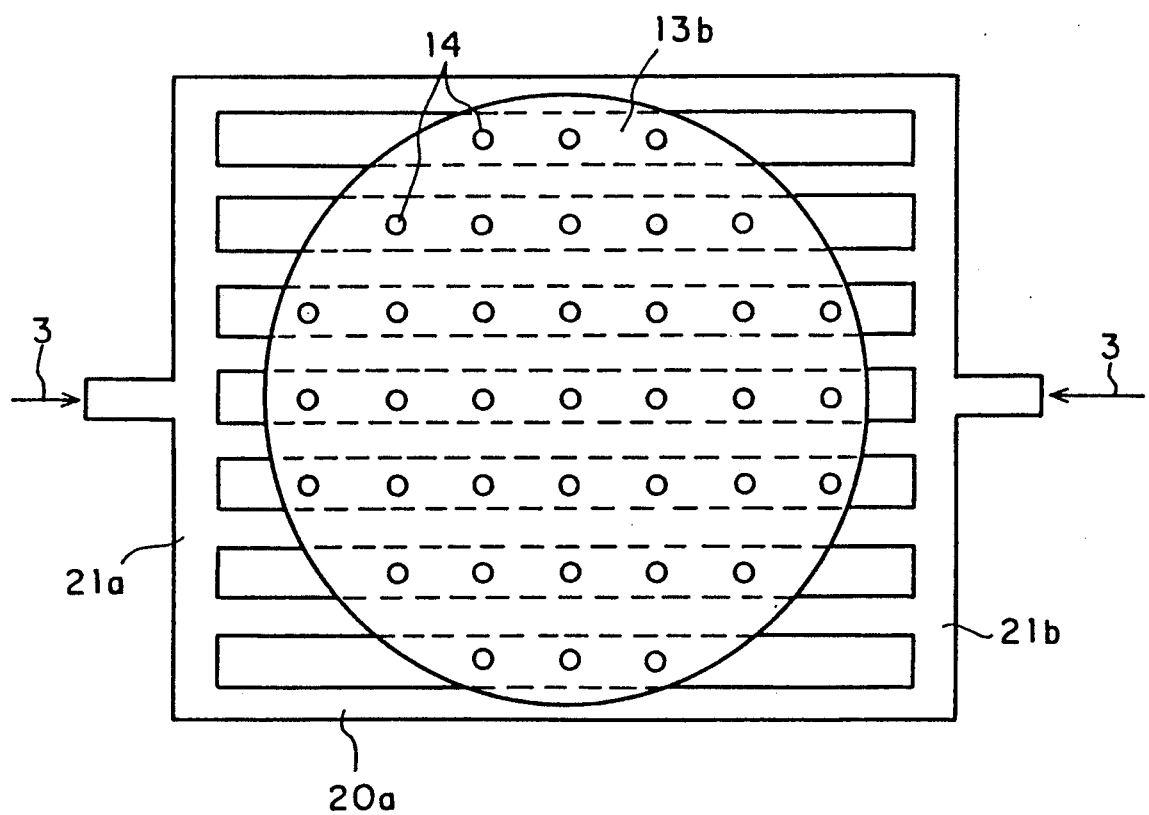

APPARATUS FOR FORMING THIN FILM

BACKGROUND OF THE INVENTION

1. Field of the Invention

This invention relates to an apparatus for forming a thin film by a CVD (Chemical Vapor Deposition) method.

2. Description of the Prior Art

With the recent tendency toward lower temperatures at which are carried out the processes for manufacturing electronic devices comprising LSIs (large scale integration integrated circuits) and liquid crystal displays, attention has been paid to the use of an afterglow microwave plasma CVD method as a process for forming a thin film on a substrate in a low-temperature condition. The afterglow microwave plasma CVD method is a technique for exciting a reactive gas by microwave plasma discharge in a plasma discharge chamber separate from a reaction chamber and transporting the thus formed active species onto a substrate heated at a relatively low temperature in the reaction chamber, thereby depositing a thin film on the substrate. In this technique, the substrate is not exposed directly to the plasma. Therefore, the charged particles in the plasma do not damage the substrate or the thin film under deposition, and the thin film can be formed at a relatively low substrate temperature of 300° C. or below.

FIG. 1 shows a sectional view of a thin film deposition device used for the afterglow microwave plasma CVD method according to the prior art, as disclosed in, for instance, the patent application published under Japanese Patent Publication No. 58-27656 (1983). Shown in the figure are a reaction chamber 1, a first reactive gas supply port 2, a first reactive gas 3, a second reactive gas 4, a microwave plasma discharge tube 5, microwave energy 6, an active species inlet port 7, an active species 8, a substrate 9, a heater 10 on which the substrate 9 is mounted, a gas exhaust port 11, and an exhaust gas 12.

When a silicon oxide film, for instance, is to be formed by the thin film deposition device constructed as mentioned above, a silane gas 3 as the first reactive gas is supplied through the reactive gas supply port 2 into the reaction chamber 1, while an oxygen atom-containing gas 4 as a second reactive gas is supplied into the microwave plasma discharge tube 5, and the resultant activated oxygen 8 is introduced through the active species inlet port 7 into the reaction chamber 1.

The activated oxygen 8 performs a gas-phase chemical reaction with the silane gas 3 in the space near the substrate, to form a precursor which contains silicon, hydrogen and oxygen atoms. The precursor is changed on the surface of the substrate 9 to form a silicon oxide film.

In this type of thin film deposition device according to the prior art, there may arise variations in the concentration of the mixed gas consisting of the reactive gas and the active species, making it impossible to deposit a thin film in a uniform film thickness on a large-area substrate.

SUMMARY OF THE INVENTION

It is accordingly an object of this invention to provide an apparatus for forming a thin film by which it is possible to form a thin film in a uniform film thickness on a large-area substrate by an afterglow microwave plasma CVD method.

It is another object of the invention to provide an apparatus for forming a thin film which is simple in construction and low in cost and by which it is possible to form a thin film in a uniform film thickness on a large-area substrate.

It is a further object of the invention to provide an apparatus for forming a thin film by which it is possible to form a thin film in a uniform film thickness on a large-area substrate without requiring special skill for the operation.

The above and other objects as well as novel features of this invention will more fully appear from a reading of the following detailed description taken in conjection with the accompanying drawings. It is to be understood, however, that the detailed description and drawings are for purposes of illustration only and are not to limit the scope of the invention.

To attain the above-mentioned objects, the apparatus for forming a thin film according to this invention comprises a reaction chamber for containing a substrate therein to form a thin film on the substrate by a reaction of a first reactive gas with an active species, the reaction chamber comprising a heater for supporting and heating the substrate, a reactive gas supply portion for supplying a first reactive gas, and an active species supply portion for supplying an active species formed through excitation of a second reactive gas, wherein the active species supply portion comprises uniformizing means comprising a flat plate disposed to cover the substrate and provided with a multiplicity of active species blow-off ports, and the reactive gas supply portion comprises diffusing means comprising a plurality of pipes disposed between the active species supply portion and the substrate and provided with a multiplicity of reactive gas blow-off ports, in order that the concentration of the first reactive gas and the active species is uniform throughout the substrate surface, and the first reactive gas and the active species are mixed with each other in the vicinity of the substrate. In the apparatus, therefore, the first reactive gas and the active species are supplied uniformly onto the substrate and are mixed with each other, and, as a result of a chemical change arising from the mixture of the first reactive gas with the active species, a uniform film deposition rate is obtained in the reaction zone in which the thin film is formed, and a uniform thin film is formed on the entire substrate surface.

BRIEF DESCRIPTION OF THE DRAWINGS

FIG. 7 is an illustration of the positional relationship between active species blow-off ports of the uniformizing means in the active species supply portion and the diffusing means in the reactive gas supply portion;

DETAILED DESCRIPTION OF THE PREFERRED EMBODIMENTS

Figure 1:
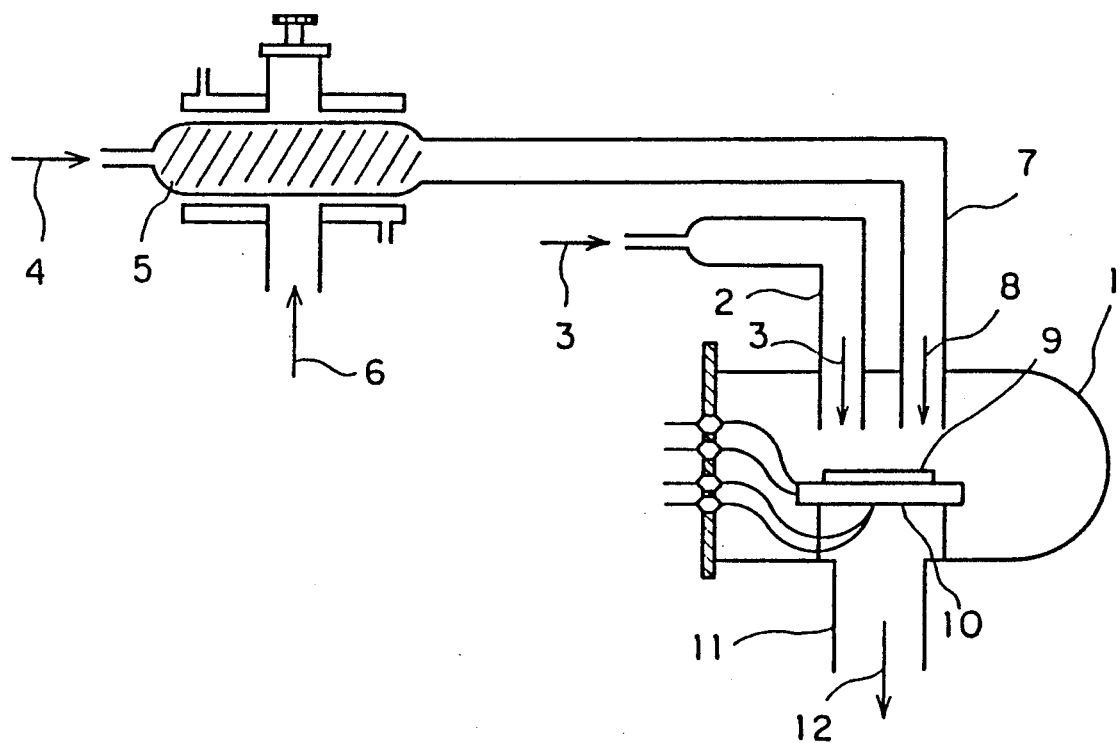
FIG. 1 shows a schematic view of the structure of a thin film deposition device according to the prior art.
Figure 2:
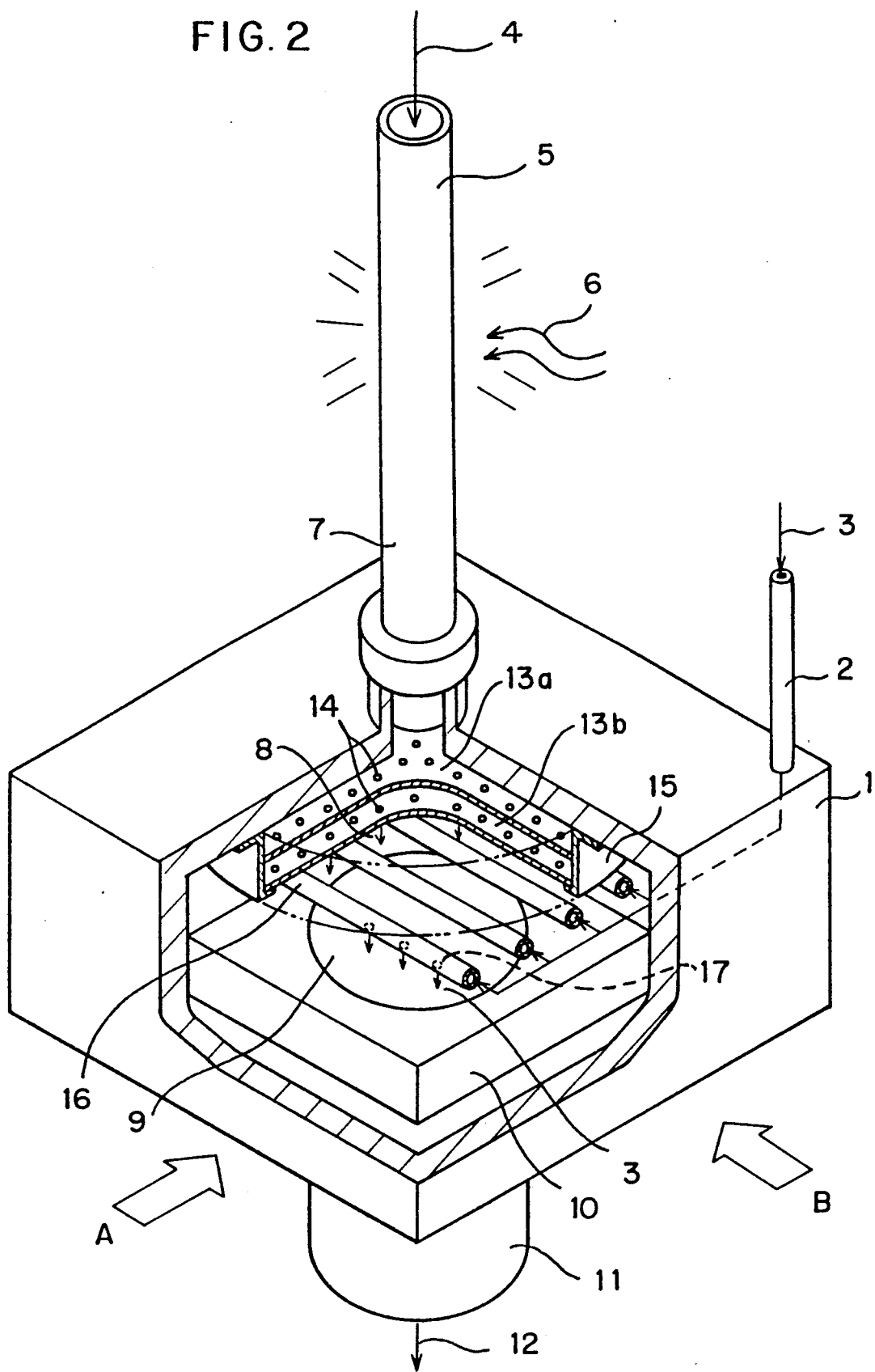
FIG. 2 shows a perspective view of the inside part of an apparatus for forming a thin film according to one embodiment of this invention.
Figure 3:
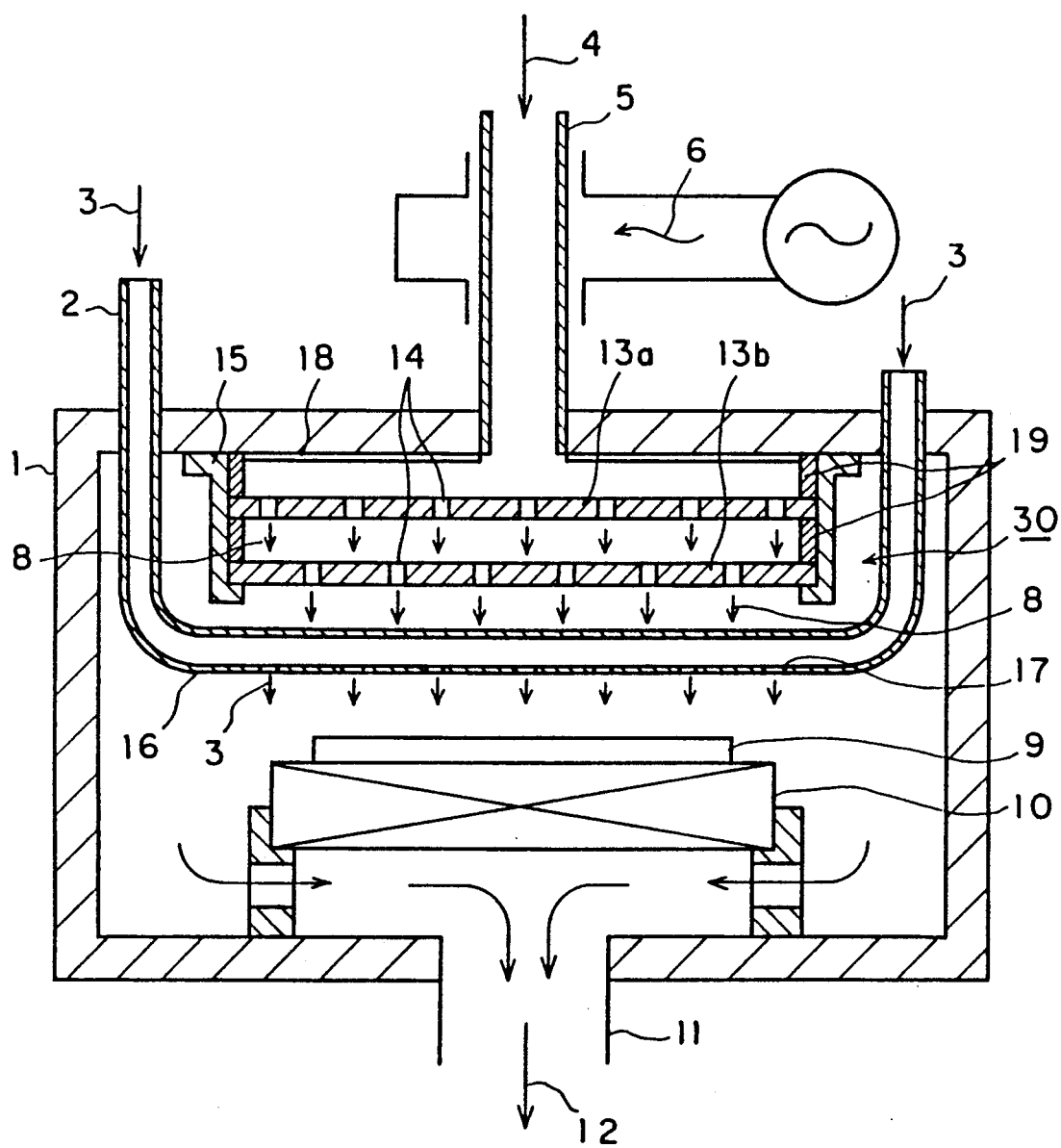
FIG. 3 shows a sectional view, from direction A, of the apparatus of FIG. 2.
Figure 4:
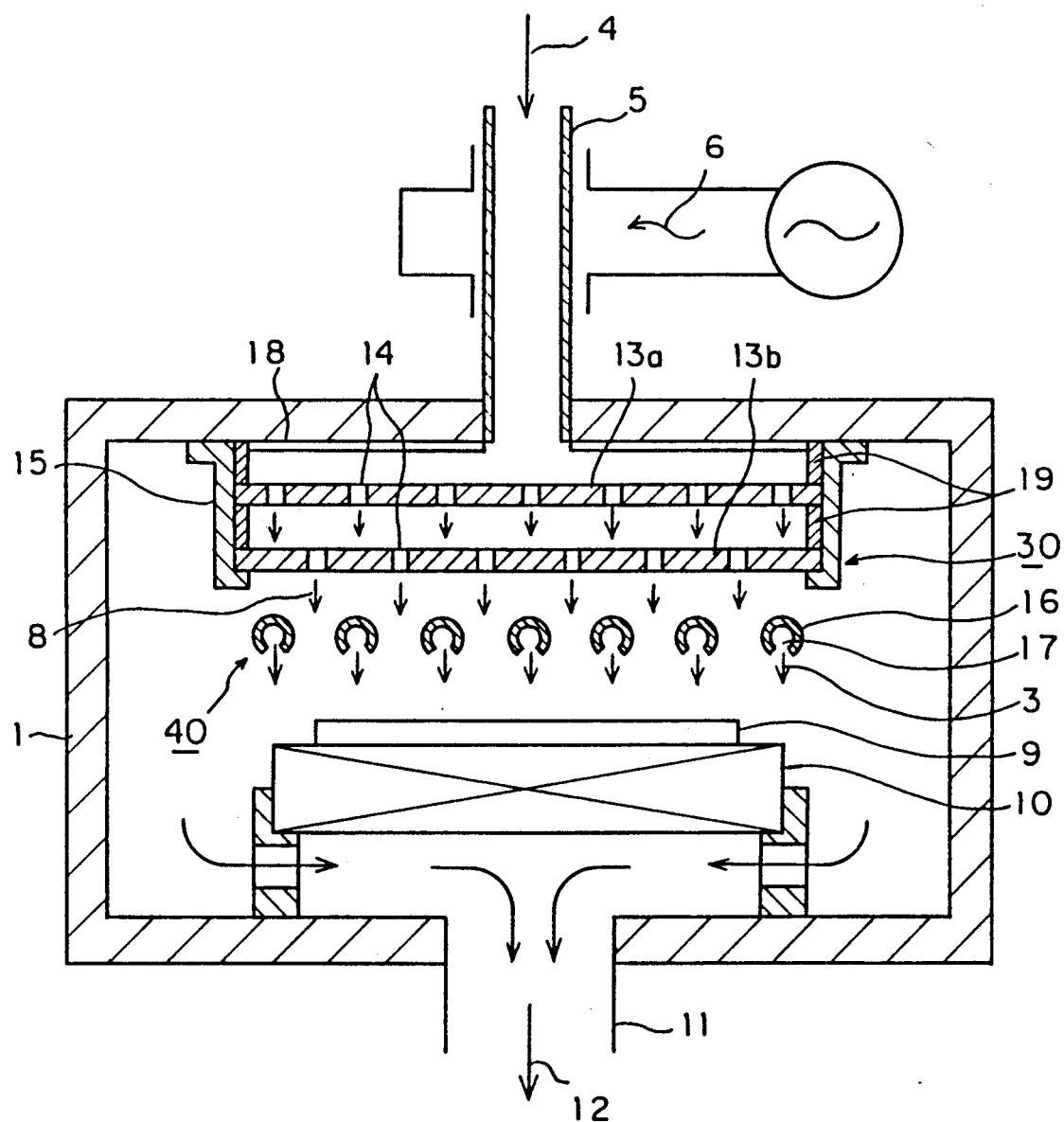
FIG. 4 shows another sectional view, from direction B, of the apparatus of FIG. 2.

The preferred embodiments of this invention will now be described in detail below referring to the accompanying drawings, FIGS. 2 to 7.

In the figures, uniformizing means 30 in an active species supply portion comprises two quartz plates 13a, 13b each provided with a multiplicity of active species blow-off ports 14, TEFLON-made spacers 19 for fixing the quartz plates 13a, 13b, and an outer wall 15 of the active species supply portion Numeral 18 denotes a quartz-made deactivation preventive plate for preventing the deactivation of activated oxygen 8 on inner walls of a reaction chamber 1. Numeral 16 denotes diffusing means in a reactive gas supply portion 40 for blowing off a first reactive gas 3, in this case a silane gas, through reactive gas blow-off ports 17 to supply the gas onto a substrate 9.

Figure 6:
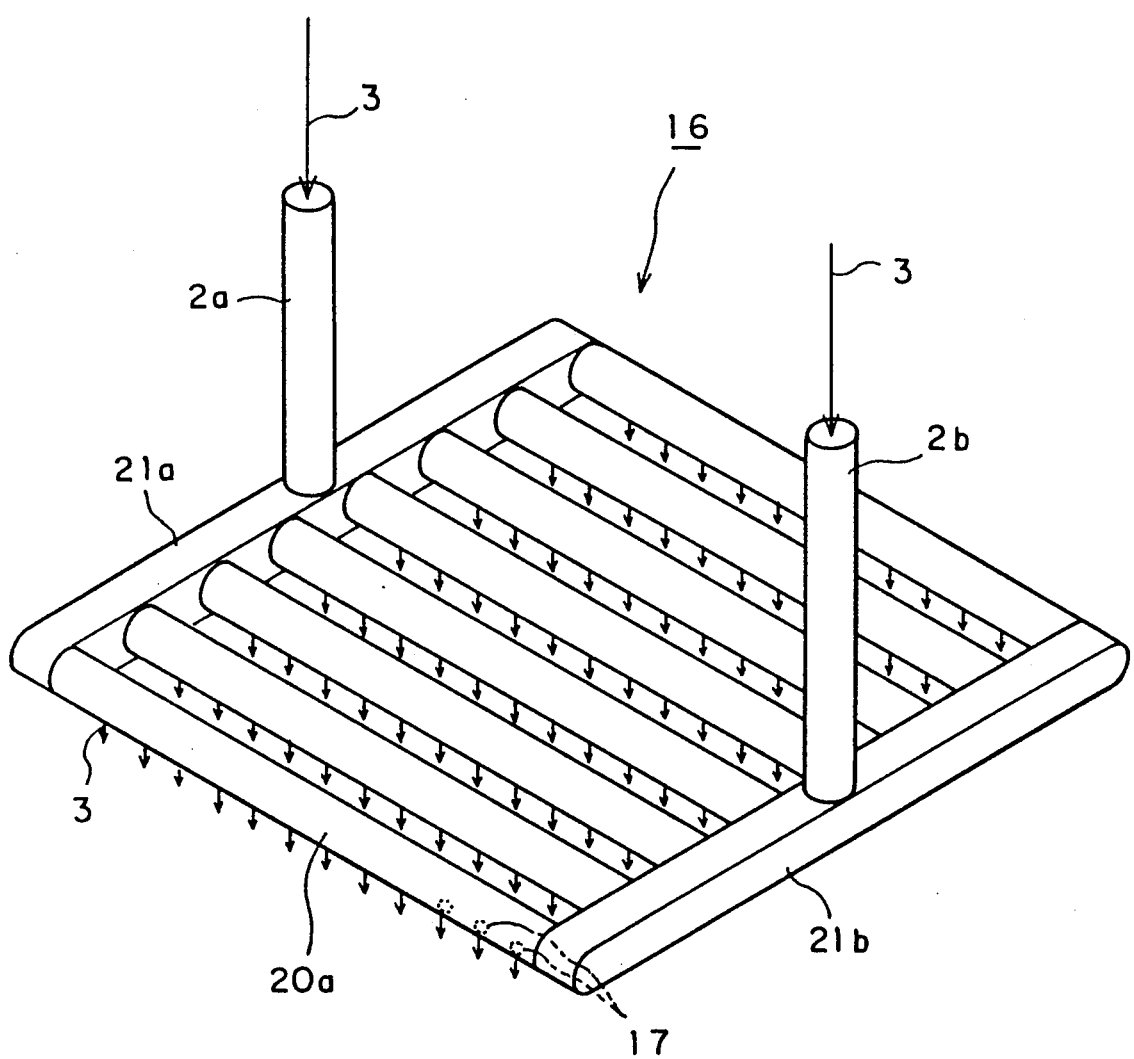
FIG. 6 shows a perspective view of diffusing means in a reactive gas supply portion.

The uniformizing means 30 in the active species supply portion has the quartz plates 13a and 13b disposed in parallel to the substrate 9 to cover the entire substrate surface The diffusing means 16 in the reactive gas supply portion 40 has, as shown in FIG. 6, a construction in which gas reservoir portions 21a, 21b for distributing uniformly the first reactive gas 3 supplied through first reactive gas supply ports 2a, 2b are connected with a plurality of both-end-open pipes 20a each provided with a multiplicity of reactive gas blow-off ports 17. The pipes 20a are disposed between the active species supply portion and the substrate in parallel to the substrate 9 so as to cover the entire substrate surface. As shown in FIG. 7, the pipes 20a are disposed directly below those portions of the quartz plate 13b which are between the active species blow-off ports 14, so that the pipes 20 do not hinder the transport of the active species onto the substrate. The quartz plate 13a is disposed between an active species inlet port 7 and the quartz plate 13b. The quartz plate 13a has active species blow-off ports 14 disposed to be laterally offset from the active species blow-off ports 14 of quartz plate 13b, so that it is possible to supply the active species uniformly onto the substrate. By rendering the reactive gas blow-off ports 17 sufficiently small, it is possible to supply the first reactive gas 3 uniformly onto the substrate.

Formation of a thin film in the apparatus according to this embodiment is carried out in the same manner as in a conventional device. Namely, the silane gas 3 as the first reactive gas is supplied through the reactive gas blow-off ports 17 onto the substrate 9, whereas an oxygen atom-containing gas 4 as the second reactive gas is supplied into a microwave plasma discharge tube 5, and the resultant activated oxygen 8 is introduced through the active species blow-off ports 14 onto the substrate 9. The activated oxygen 8 and the silane gas 3 perform a gas-phase chemical reaction with each other in the space near the substrate to form a silicon oxide film on the surface of the substrate 9. In this case, the silane gas 3 is distributed by the gas reservoir portions 21a and 21b into the plurality of both-end-open pipes 20a, and supplied through the multiplicity of reactive gas blow-off ports 17 uniformly onto the substrate 9, whereas the activated oxygen 8 is fed through the two quartz plates 13a and 13b to be thereby supplied uniformly onto the substrate 9 via the active species blow-off ports 14. Therefore, the concentrations of the reactive gas and the active species are uniform on the substrate, which enables formation of a uniform thin film over the entire substrate surface.

With the apparatus for forming a thin film of the present invention, it is possible to cope with an increase in the size of the substrate to be treated, by enlarging the quartz plates 13a, 13b and increasing the number of the pipes 20a according to the size of the substrate.

Figure 5:
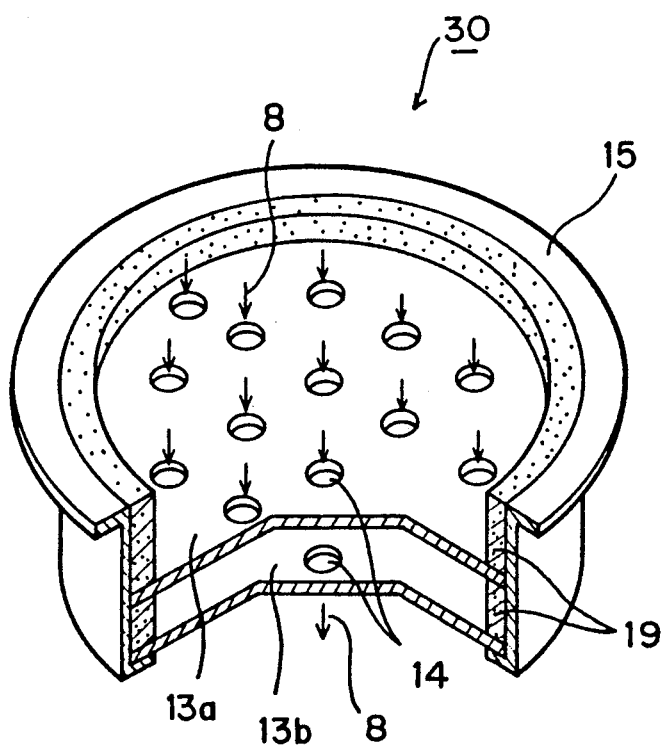
FIG. 5 shows a sectional perspective view of uniformizing means in an active species supply portion.
Figure 8:
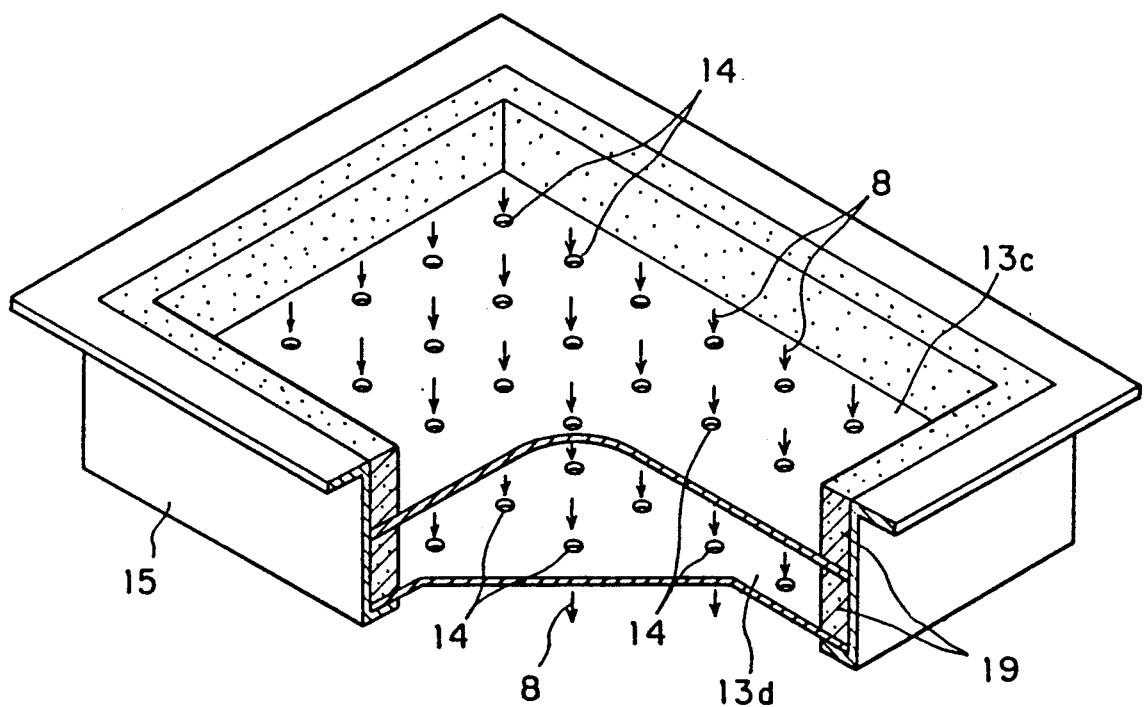
FIG. 8 shows a sectional perspective view of a uniformizing means in an active species supply portion according to another embodiment of the invention.
Figure 9:
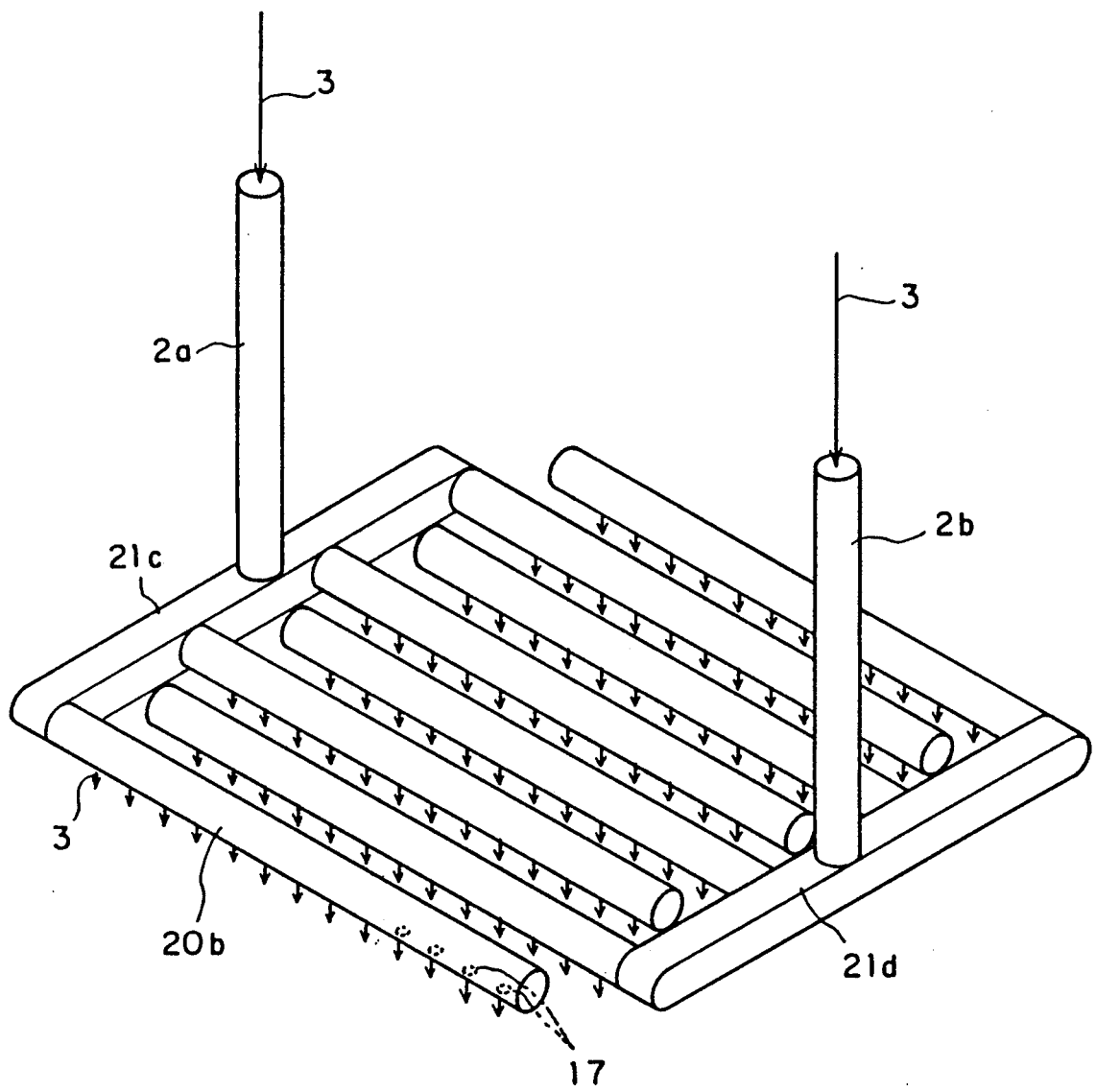
FIG. 9 is a perspective view of a diffusing means in a reactive gas supply portion according to the embodiment of the invention shown in FIG. 8.

Though the uniformizing means in the active species supply portion has been described as being cylindrical in the above embodiment as illustrated in FIG. 5, the uniformizing means may be rectangular parallelopiped, as in another embodiment of this invention shown in FIG. 8, which makes it possible to cope with a rectangular substrate. Besides, the diffusing means in the reactive gas supply portion may have a construction in which a plurality of pipes 20b each opened at one end thereof are connected in alternately opposite directions, as shown in FIG. 9.

As has been described above, according to this invention, the apparatus for forming a thin film comprises a reaction chamber for containing a substrate to form a thin film on the substrate by a reaction between the first reactive gas and the active species, the reaction chamber comprising a heater for supporting and heating the substrate, a reactive gas supply portion for supplying a first reactive gas, and an active species supply portion for supplying an active species formed through excitation of a second reactive gas, wherein the active species supply portion comprises uniformizing means comprising a flat plate disposed to cover the substrate and provided with a multiplicity of active species blow-off ports, and the reactive gas supply portion comprises diffusing means comprising a plurality of pipes disposed between the active species supply portion and the substrate and provided with a multiplicity of reactive gas blow-off ports, in order that the concentrations of the first reactive gas and the active species are uniform on the substrate respectively, and the first reactive gas and the active species are mixed with each other in the vicinity of the substrate. With this construction, the apparatus according to the invention ensures uniformity of the respective concentrations of the reactive gas and the active species on the substrate, and enables formation of a uniform thin film over the entire surface area of a large substrate.

What is claimed is:

1. An apparatus for forming a thin film which comprises a reaction chamber for containing a substrate therein and forming the thin film on a surface of said substrate by a reaction of a first reactive gas with an active species formed through excitation of a second reactive gas, said reaction chamber comprising:

heater means for supporting and heating said substrate;

a reactive gas supply portion comprising diffusing means disposed facing and completely covering the surface of said substrate so as to diffuse the first reactive gas and supply uniformly said first reactive gas directly over the surface of said substrate; and active species supply means comprising uniformizing means disposed adjacent said diffusing means on a side opposite said substrate surface and completely covering said substrate surface, so as to introduce said active species and uniformly mix said active species with said first reactive gas in the vicinity of the surface of the substrate directly over the entire area of the substrate, and supply uniformly the mixed gas subsequent to a gas-phase chemical reaction to the surface of said substrate for forming said thin film.

2. The apparatus as set forth in claim 1, wherein said diffusing means comprises a plurality of pipes each having a multiplicity of reactive gas blow-off ports.

3. The apparatus as set forth in claim 1, wherein said uniformizing means comprises a flat plate body disposed to cover said substrate, said flat plate body provided with a multiplicity of active species blow-off ports in the surface thereof.

4. The apparatus as set forth in claim 2, wherein said plurality of pipes comprises a pair of comb-shaped bodies each obtained by connecting a plurality of pipes each opened at one end thereof, the comb-shaped bodies combined together oppositely to each other so that the teeth of the comb-shaped bodies mesh with each other.

5. The apparatus as set forth in claim 3, wherein the shape of a portion of said uniformizing means facing the surface of said substrate conforms to the outer shape of said substrate.

6. The apparatus as set forth in claim 3, wherein said flat plate body is composed of quartz.

* * * * *